United States Patent [19]

Shum

[11] 4,250,449
[45] Feb. 10, 1981

[54] DIGITAL ELECTRIC ENERGY MEASURING CIRCUIT

[75] Inventor: Lanson Y. Shum, Delmont, Pa.

[73] Assignee: Westinghouse Electric Corp., Pittsburgh, Pa.

[21] Appl. No.: 963,618

[22] Filed: Nov. 24, 1978

[51] Int. Cl.³ .............................................. G01R 21/06
[52] U.S. Cl. ........................................................ 324/142
[58] Field of Search ........................... 324/142; 364/483

[56] References Cited

U.S. PATENT DOCUMENTS

| | | | |
|---|---|---|---|
| 4,056,774 | 11/1977 | Shum | 324/142 |
| 4,079,313 | 3/1978 | Callan | 324/142 |

FOREIGN PATENT DOCUMENTS 1373581  11/1974  United Kingdom .................... 324/142

Primary Examiner—Stanley T. Krawczewicz
Attorney, Agent, or Firm—E. L. Pencoske

[57] ABSTRACT

A digital electric energy measuring circuit for totalizing electrical power and energy usage from an alternating current supply by converting a voltage signal representing the current component into a pulse train signal whose frequency is proportional to the magnitude of the voltage, sampling that frequency to provide a digital value representing the current component, and then converting a voltage signal representing the voltage component into a second pulse train signal whose frequency is proportional to the magnitude of the voltage which is used to control the rate that the digitized value of the current component is successively added which provides an indication of electrical energy that is totalized and displayed.

9 Claims, 6 Drawing Figures

DIGITAL ELECTRIC ENERGY MEASURING CIRCUIT

BACKGROUND OF THE INVENTION

1. Field of the Invention

This invention pertains to electric energy measuring circuits and more specifically to electronic watthour metering circuits employing digital techniques for computing the product of voltage and current components.

2. Description of the Prior Art

The electromechanical rotating disc-type of watthour meter continues to be used almost exclusively in electrical metering applications. However, alternate metering methods are being sought in order to facilitate functions such as time-of-day metering and load control.

The electrical energy supplied to a circuit is the product of measured power and the period of time during which that power level is measured. AC power can be determined by multiplying the peak voltage and peak current together with the power factor. This method requires circuitry for measuring the peak values of the voltage and current components. Additional circuitry is needed to determine the phase angle between the voltage and current components and for generating a cosine function to produce the power factor.

Much of this circuitry was eliminated in U.S. Pat. No. 4,056,774 for "An Electronic Watthour Meter Circuit" issued Nov. 1, 1977 and assigned to the assignee of this invention, which described a circuit that sampled both the current component and the voltage component at a time when the voltage component was at its peak value. Bandpass filters are used to smooth out the input wave forms to facilitate this peak detection. This type of sampling provided a peak value for the voltage component and a value for the current component which was equal to the peak value of the current component multiplied by the cosine of the phase angle between the voltage and current components thus eliminating the need for phase angle detection and generation of the cosine function. While this circuit finds uses in various applications it may be desirable to sample at a faster or different sampling rate. It may also be desirable not to filter the input wave forms. These features and others are incorporated in the present invention.

SUMMARY OF THE INVENTION

The present invention is a new and improved electric energy measuring circuit. Transformers are used to develop analog voltage signals proportional to the voltage and current components of electrical energy in an external circuit. These two analog voltage signals are each converted into a pulse train signal proportional to the magnitude and a sign bit signal representing the instantaneous polarity of the converted voltage signal. The two sign bit signals are applied to a logic gate which provides an addition/subtraction command signal. The pulse train signal proportional to the current component is sampled to provide a digital value. This digital value is applied to a summing circuit which successively adds or subtracts that digital value depending upon the addition/subtraction command signal. The rate of addition or subtraction is controlled by the pulse train signal proportional to the voltage component. Carry bit and borrow bit outputs of the summing circuit carry the pulses which represent quantized units of energy. These pulses are applied to an up/down counter with the overflow used to increment a totalizer and display.

DESCRIPTION OF THE PREFERRED EMBODIMENTS

Figure 1:
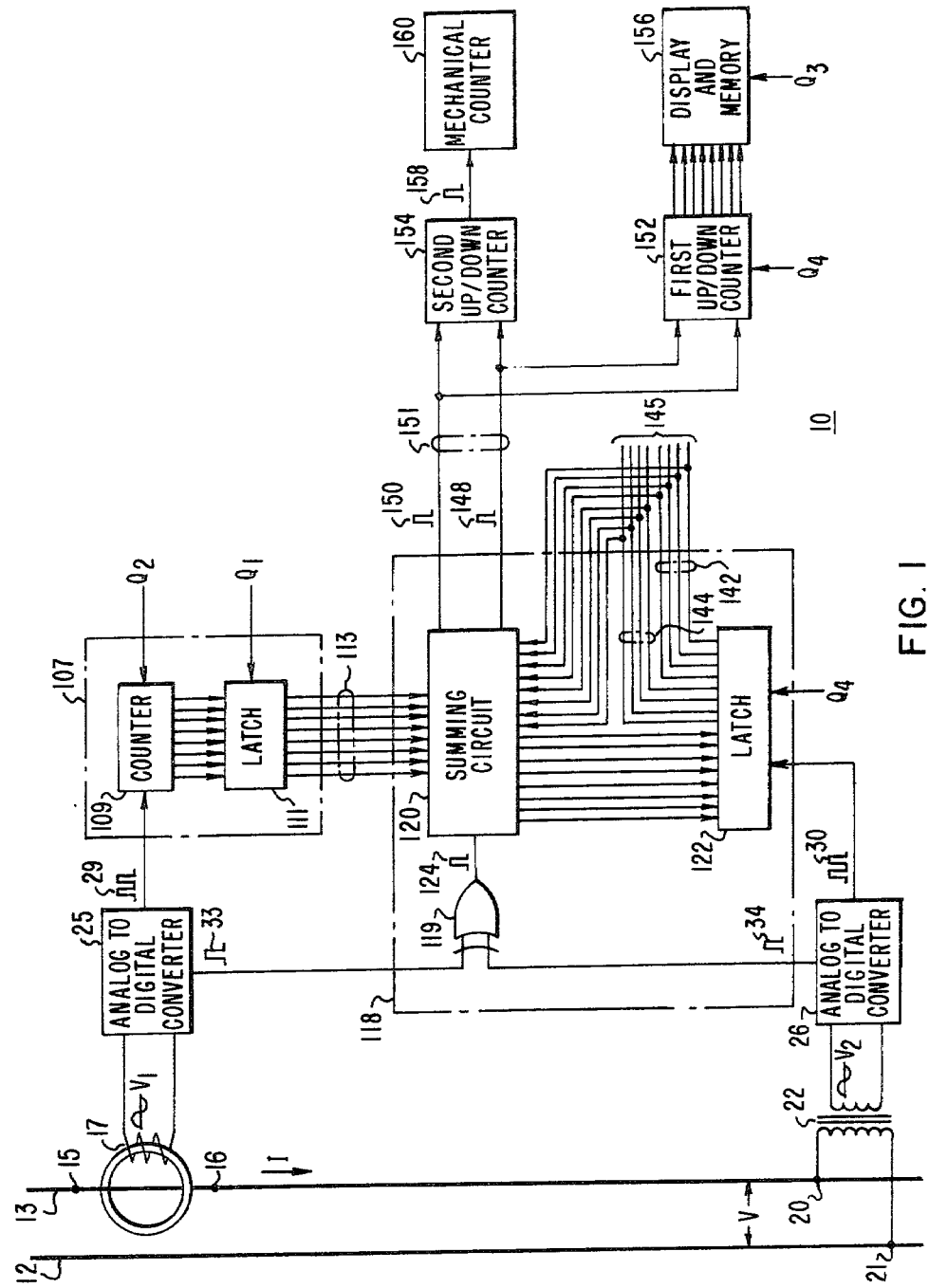
FIG. 1 is a schematic block diagram of an electronic watthour meter circuit constructed according to this invention.

Referring to FIG. 1 there is shown a schematic block diagram of a preferred embodiment of an electronic watthour meter circuit 10 of this invention which measures AC electrical power and energy. The invention is disclosed for measuring active power and energy in single phase or polyphase systems including an AC electrical source and load (not shown) connected to conductors 12 and 13.

Circuit 10 develops two analog voltage signals each having positive and negative portions. The first voltage signal $V_1$ is proportional to the current component I of the AC energy to be measured flowing in conductors 12 and 13; the second voltage signal $V_2$ is proportional to the voltage component V of the AC energy to be measured flowing in conductors 12 and 13. FIG. 1 shows circuit 10 having current input terminals 15 and 16 connected to the primary side of a single turn current transformer 17 and voltage input terminals 20 and 21 connected to a voltage transformer 22. The output signal $V_1$ of current transformer 17 is proportional to I. The output signal $V_2$ of voltage transformer 22 is proportional to V. The output signals $V_1$ and $V_2$ of transformers 17 and 22, respectively, are input to two analog-to-digital converters 25 and 26 respectively. The analog-to-digital converters translate the analog signals $V_1$ and $V_2$ into pulse train signals 29 and 30 respectively, with each pulse train signal having a frequency proportional to the magnitude of the converted analog voltage signal. Polarity indicating signals 33 and 34 represent the instantaneous polarities of analog signals $V_1$ and $V_2$ respectively. Further details on the construction and operation of the analog-to-digital converters will be given hereinafter.

Figure 2:
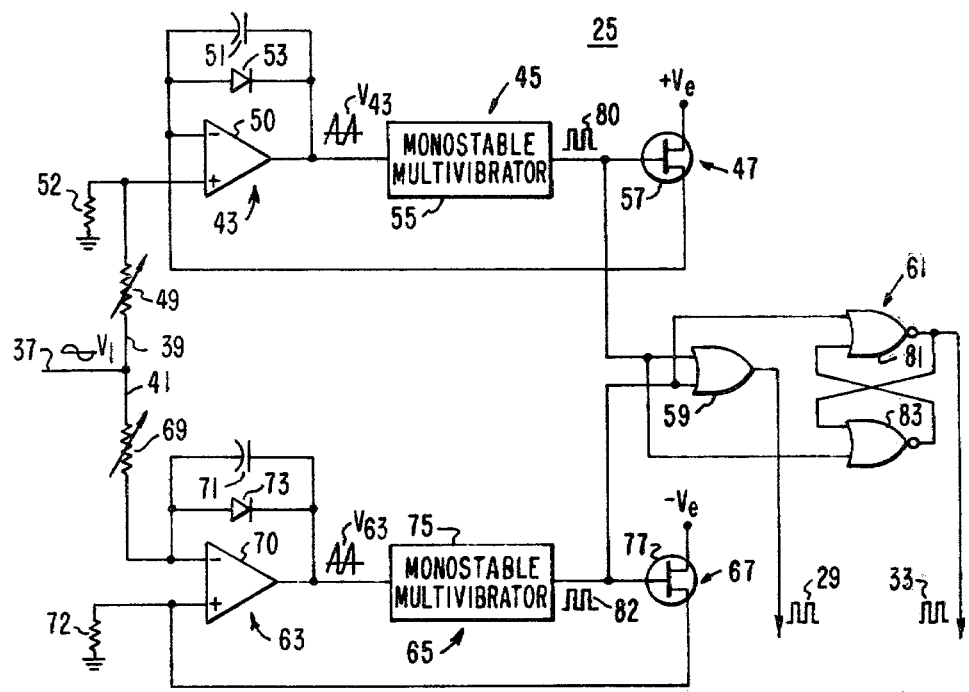
FIG. 2 is a schematic of a bi-directional voltage-to-frequency converter constructed according to this invention.

Referring to FIG. 2 the bi-directional voltage-to-frequency analog-to-digital converter 25 is shown which is used to convert the analog voltage signal $V_1$ into a pulse train signal 29 and a polarity indicating signal 33. The input terminal 37 is connected to a first circuit path 39 and a second circuit path 41 which is in parallel with the first circuit path. The first circuit path 39 is responsive to the positive portion of the analog input signal $V_1$ and includes an integrator 43, pulse generator 45, and a capacitor discharge circuit 47.

At the integrator 43 a variable input resistor 49 is connected between the input terminal 37 and the non-inverting terminal of an operational amplifier 50. A resistor 52 is connected between the non-inverting terminal of the amplifier 50 and ground. A storage capacitor 51 and diode 53 are connected in parallel across the inverting terminal and the output terminal of the operational amplifier 50 forming the integrator 43 which is responsive to the positive portion of the analog input signal $V_1$. The output of the operational amplifier 50 is connected to the pulse generator 45 which in the preferred embodiment is a monostable multivibrator 55 that generates a pulse whenever the input voltage exceeds the threshold voltage of the monostable multivibrator. The output of the monostable multivibrator 55 is connected to the gate terminal of a field effect transistor (hereinafter called FET) 57. The drain terminal of the FET 57 is connected to a positive voltage source $V_e$; the source terminal is connected to the inverting input of the operational amplifier 50. The FET 57 and positive voltage source $V_e$ make up the capacitor discharge circuit 47. The output of the monostable multivibrator 55 is used as one of the two inputs for the OR gate 59 and as one of the two inputs for the logic circuit 61.

Referring back to the input terminal 37, the second circuit path 41 is responsive to the negative portion of the analog input signal $V_1$ and includes an integrator 63, pulse generator 65, and a capacitor discharge circuit 67. At the integrator 63, a variable input resistor 69 is connected between the input terminal 37 and the inverting terminal of an operational amplifier 70. A resistor 72 is connected between the non-inverting terminal of the amplifier 70 and ground. A storage capacitor 71 and diode 73 are connected in parallel across the inverting terminal and the output terminal of the operational amplifier 70 forming integrator 63 is responsive to the negative portion of the analog input signal $V_1$. The output of the operational amplifier 70 is connected to the pulse generator 65 in the preferred embodiment is a monostable multivibrator 75 that generates a pulse whenever the input voltage exceeds the threshold voltage of the monostable multivibrator. The output of the monostable multivibrator 75 is connected to the gate terminal of an FET 77. The source terminal of the FET 77 is connected to a negative voltage source $-V_e$; the drain terminal is connected to the non-inverting input of the operational amplifier 70. The FET 77 and negative voltage source $-V_e$ make up the capacitor discharge circuit 67. The output of the monostable multivibrator 75 is used to provide the second of two inputs for the OR gate 59 and as the second of two inputs for the logic circuit 61.

Figure 3:
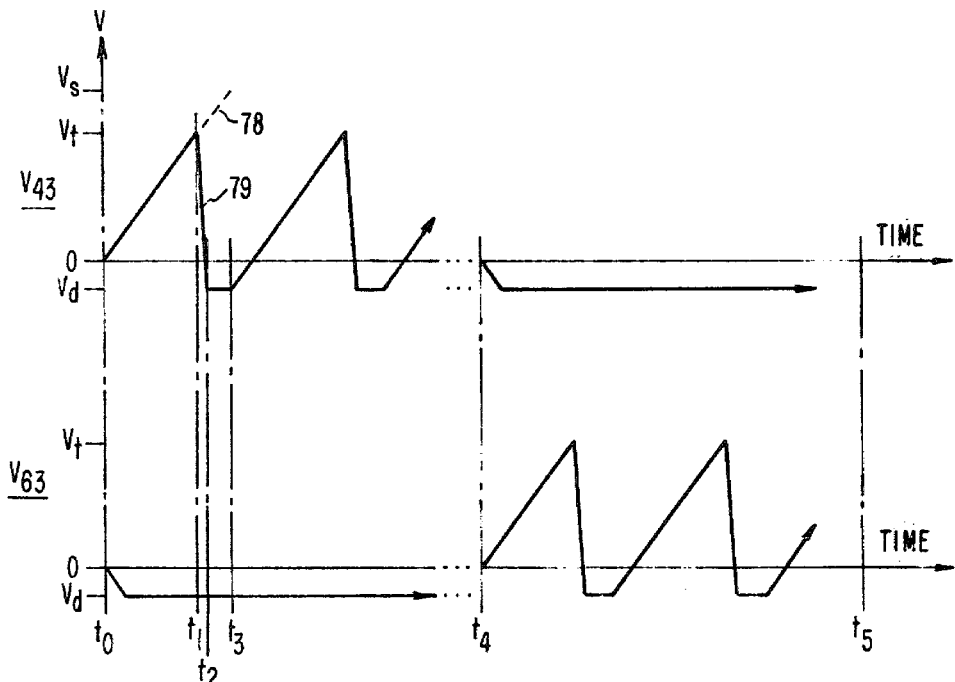
FIG. 3 is a time graph of the output signals of the integrators of a bi-directional voltage-to-frequency analog to digital converter.

The operation of the bi-directional voltage-to-frequency converter 25 can be more easily understood by referring to FIG. 3 wherein there is shown a graph of voltage output signals $V_{43}$ and $V_{63}$ of integrators 43 and 63 when the analog input voltage signal $V_1$ is both positive and negative. When the analog input voltage signal $V_1$ is positive, shown on the graph from time $t_0$ to time $t_4$, the diode 53 of the integrator 43 is reverse biased and conducts no current allowing the storage capacitor 51 to become charged in proportion to the analog input voltage signal. The output signal $V_{43}$ of the integrator 43 corresponds to the charge stored in the capacitor 51 and is shown as $V_{43}$ versus time. The magnitude of $V_{43}$ increases linearly from $t_0$ to $t_1$ and would continue to do so as shown by the dotted line 78 until the operational amplifier 50 reached saturation at $V_s$. However, when the magnitude of $V_{43}$ reaches the threshold voltage $V_t$ of the monostable multivibrator 55, the monostable multivibrator generates an output pulse which has a duration of from $t_1$ to $t_3$ and is applied to the gate of the FET 57. During this time, the FET 57 is conductive and the capacitor 51 is connected to the positive voltage source $V_e$. The capacitor 51 rapidly discharges as shown by the line segment 79. At time $t_2$, the capacitor is completely discharged and the diode 53 is forward biased due to $V_e$. This forward biasing causes the diode 53 to conduct current from time $t_2$ to time $t_3$. During this time, from $t_2$ to $t_3$, the capacitor is unable to charge and the output voltage signal $V_{43}$ remains at $V_d$ which is the forward voltage drop across the diode 53. At time $t_3$, the monostable multivibrator pulse is no longer applied to the gate of the FET 57. The FET becomes non-conductive and the capacitor 51 begins to charge again repeating the process. The greater the amplitude of the analog input signal the faster the capacitor 51 will charge thus causing the monostable multivibrator 55 to produce more pulses.

During the time the analog input voltage signal $V_1$ is positive, shown on the graph from time $t_0$ to time $t_4$, the diode 73 of the integrator 63 is forward biased and conducts current. The storage capacitor 71 is unable to charge and the output signal $V_{63}$ of the integrator 63 remains at $V_d$. When the analog input voltage signal $V_1$ is negative, shown on the graph from time $t_4$ to time $t_5$, the operation of the integrators 43 and 63 is reversed. That is, the voltage signal $V_{63}$ is a sawtooth wave and the voltage signal $V_{43}$ remains at $V_d$. In this manner both the positive and negative portions of the analog input voltage signal $V_1$ are converted to a pulse train signal 29 whose frequency is proportional to the magnitude of the input voltage signal.

Having discussed the operation of the integrators 43 and 63, the operation of the remainder of the bi-directional voltage-to frequency analog-to-digital converter 25 will now be discussed. Referring to FIG. 2 the output signals 80 and 82 from the monostable multivibrators 55 and 75, respectively, are input to an OR gate 59 which provides a single pulse train output signal 29 whose frequency is proportional to the magnitude of the analog input voltage signal $V_1$. The output signal 82 of the monostable multivibrator 75 is also applied to the first NOR gate 81 of the logic circuit 61. The output signal 80 of the monostable multivibrator 55 is also applied to the second NOR gate 83 of the logic circuit 61. The outputs of the NOR gates 81 and 83 are cross-coupled to an input of the other NOR gate, with the output of the NOR gate 81 also providing the output signal 33 of the logic circuit 61. When the instantaneous polarity of the analog input signal $V_1$ is positive, the output signal 33 of the NOR gate 81 is a binary one, and when the instantaneous polarity of the analog input signal $V_1$ is negative, the output signal 33 is a binary zero.

The circuit shown in FIG. 2 can be fabricated using standard commercially available components. Typical part numbers are SN72747 for the operational amplifiers 50 and 70 and SN74123 for the monostable multivibrators 55 and 75. The frequency of the output pulse train signal 29 can be adjusted by changing the value of the charging capacitors 51 and 71. The variable resistors 49 and 69 are used to offset differences between integrators 43 and 63, and differences in the threshold voltages of monostable multivibrators 55 and 75 so that the scaling of the positive and negative portions of the analog input voltage signal $V_1$ will be the same.

It is to be understood that the analog-to-digital converters 25 and 26 are identical and that the structural and functional descriptions given hereinabove for the analog-to-digital converter 25 are applicable to the analog-to-digital converter 26.

Figure 4:
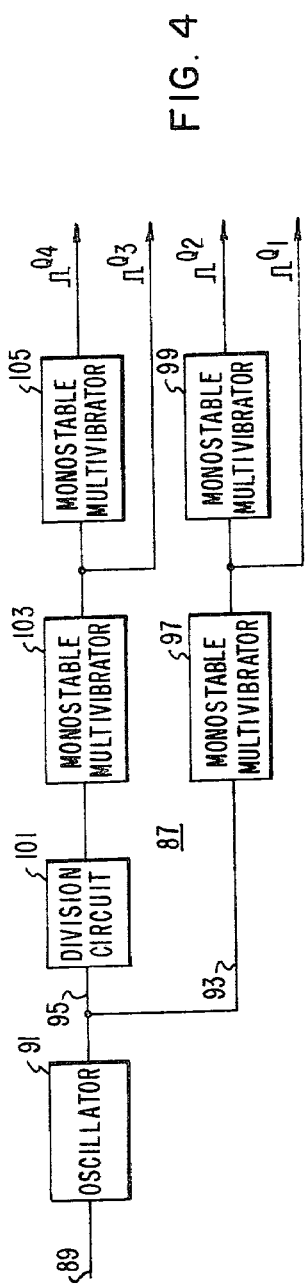
FIG. 4 is a schematic block diagram of a clock circuit for supplying different clock pulses to the circuit shown in FIG. 1.
Figure 5:
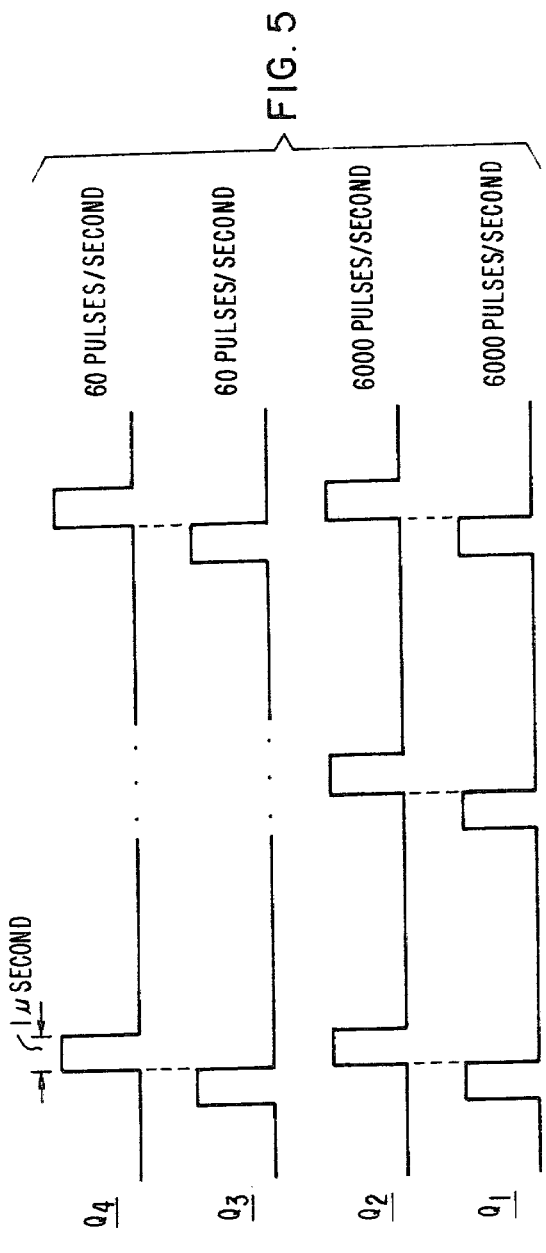
FIG. 5 is a time graph of the clock pulses produced by the circuit shown in FIG. 4.

Referring back to FIG. 1, it can be seen that the electronic watthour meter circuit 10 requires several clock pulse signals. Before continuing the discussion of FIG. 1, the clock circuit 87 shown in FIG. 4 will be discussed. The clock circuit 87 is a conventional clock circuit which develops the clock pulse signals necessary for sampling and resetting purposes. The clock circuit input 89 receives line voltage 60 Hz AC. This is the input to an oscillator 91 which is chosen to yield the desired sampling rate. The output of the oscillator is connected to a first circuit path 93 and a second circuit path 95 which are in parallel. The first circuit path 93 includes a pair of cascade-connected monostable multivibrators, the multivibrator 97 produces clock pulse signal $Q_1$ and the multivibrator 99 produces clock pulse signal $Q_2$. The second circuit path 95 includes a division circuit 101 connected in series with a pair of cascade-connected monostable multivibrators, the multivibrator 103 produces clock pulse signal $Q_3$ and the multivibrator 105 produces clock pulse signal $Q_4$. For the purposes of illustration and not limitation oscillator 91 is a 6,000 Hz oscillator and the division circuit 101 divides the input by one-hundred. SN74123 is a typical TTL part number for the monostable multivibrators 97, 99, 103 and 105. The resulting clock pulse signals are shown in FIG. 5. $Q_1$ is a clock pulse signal having a frequency of 6,000 pulses per second. $Q_2$ also has a frequency of 6,000 pulses per second but lags $Q_1$ by one microsecond. $Q_3$ has a frequency of 60 pulses per second. $Q_4$ has a frequency of 60 pulses per second but lags $Q_3$ by one microsecond. The uses for the clock pulse signals $Q_1$ through $Q_4$ are discussed hereinbelow.

Returning to the electronic watthour meter circuit 10 shown in FIG. 1, the output pulse train signal 29 of the analog-to-digital converter 25 is the input to the sampling circuit 107. The sampling circuit 107 is a conventional sample and hold circuit composed of a counter 109 and a latch 111. The counter 109 counts the pulses of the pulse train signal 29 and presents the count as a binary coded number at the parallel output terminals of the counter 109. When the latch 111 receives a pulse of clock pulse signal $Q_1$, it accepts the binary coded number from the counter 109 and continuously presents that binary coded number at its parallel output terminals which are the output 113 of the sampling circuit 107. One microsecond after the pulse of $Q_1$ is received by the latch 111, the counter 109 receives a pulse of clock pulse signal $Q_2$ which resets the counter to zero. This sequence enables the sampling circuit 107 to provide at its output 113, an output signal called the sample signal, which is proportional to I. Typical TTL part numbers are SN7490 for the counter 109 and SN7475 for the latch 111.

Figure 6:
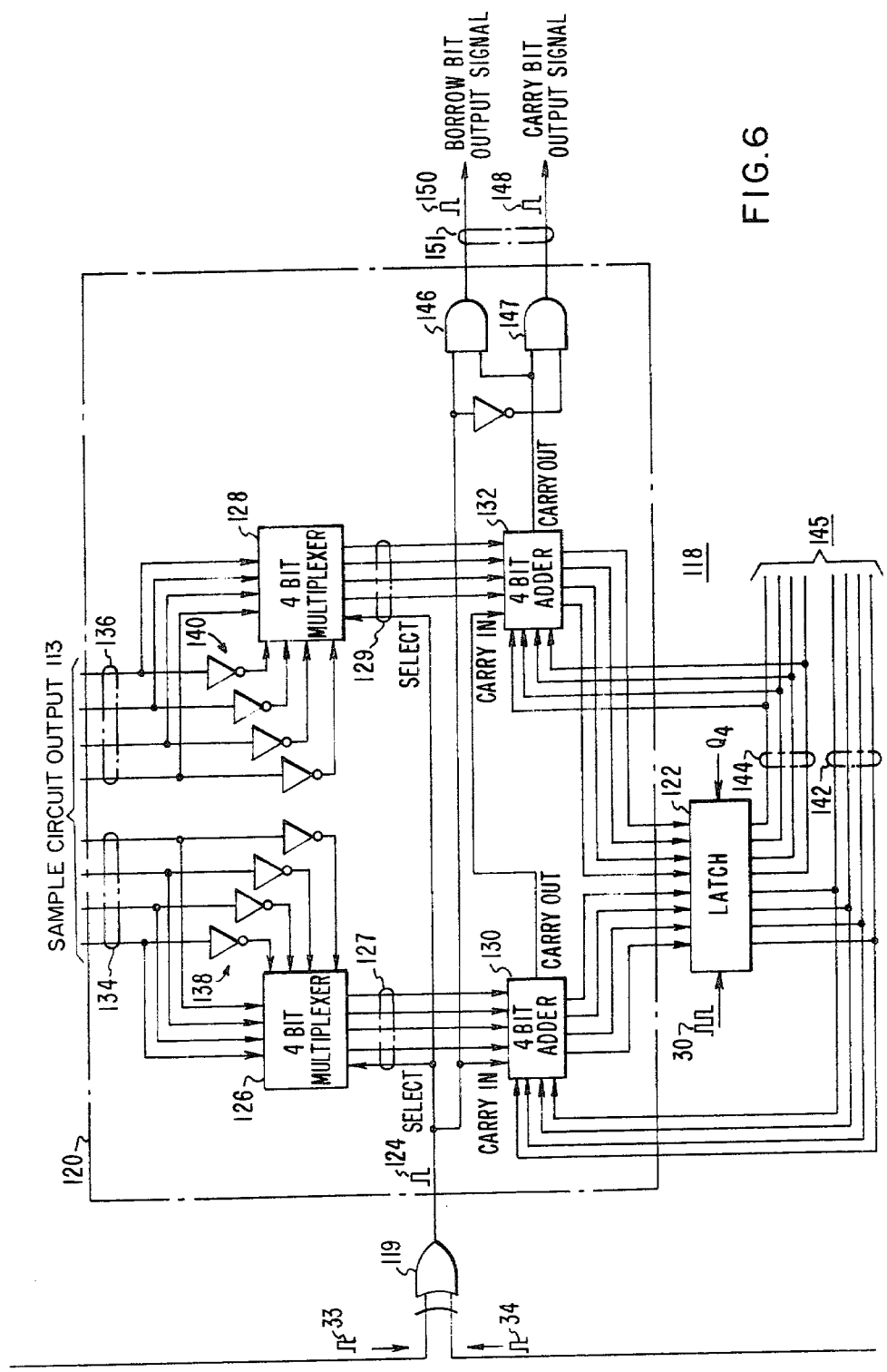
FIG. 6 is a schematic block diagram of an addition circuit included in the circuit shown in FIG. 1.

The addition circuit 118 shown in FIG. 1 is shown in detail in FIG. 6. The addition circuit includes an exclusive OR gate 119, summing circuit 120 and the latch 122. The exclusive OR gate receives the polarity indicating signals 33 and 34 and provides an addition/subtraction command signal 124. The addition/subtraction command signal 124 is a binary one to effect subtraction and a binary zero to effect addition. The summing circuit 120 includes two four-bit multiplexers 126 and 128 and two four-bit adders 130 and 132. The inputs of the multiplexer 126 and 128 make up one of the data inputs of the addition circuit 118. The multiplexer 126 receives the four least significant bits 134 of the sample signal and the complement of the four least significant bits by applying the bits 134 to four inverters 138. The multiplexer 128 receives the four most significant bits 136 of the sample signal and the complement of the four most significant bits by applying the bits 136 to four inverters 140. The addition/subtraction command signal 124 is applied to the select terminal of each of the two multiplexers 126 and 128. When the addition/subtraction command signal 124 is a binary one, the multiplexers present the complement of the sample signal at their outputs. When the addition/subtraction command signal 124 is a binary zero, the sample signal is presented at the multiplexer' outputs. The adder 130 is connected to the output 127 of the multiplexer 126. The adder 132 is connected to the output 129 of the multiplexer 128. The output signals of both adders 130 and 132 are applied to the latch 122. The four least significant bits 142 which are the output of the latch 122 are connected to the adder 130. The four most significant bits 144 which are the output of the latch 122 are connected to the adder 132. The outputs 142 and 144 of the latch 122 make up both the data output of the addition circuit 118 and the second data input of the addition circuit 118.

The addition circuit 118 operates as follows. The pulse train signal 30 is applied to the triggering input of the latch 122. The latch 122 accepts new data from the adders 130 and 132 whenever a pulse is present in pulse train signal 30. The latch is reset to zero by clock pulse signal $Q_4$. The contents of the latch 122 are continually presented at the data output 142 and 144 of the latch. The adder 130 instantly adjusts its output signal to reflect the sum of the two signals at inputs 127 and 142. The adder 132 instantly adjusts its output signal to reflect the sum of the two signals at inputs 129 and 144. The adders 130 and 132 then present new data to the latch 122. This new data is accepted by the latch 122 when a pulse is present in pulse train signal 30, the new contents being presented at the data output 142 and 144 of the latch. In this manner, the sample signal is successively added. The rate of addition is controlled by the frequency of the pulse train signal 30 which is proportional to the voltage component V. The frequency of the pulse train signal 30 must be greater than the frequency of the clock pulse signals used to control the rate at which pulse train signal 29 is sampled. SN74158 and SN7483 are standard TTL part numbers for the multiplexers 126 and 128 and adders 130 and 132 respectively.

Addition is performed when the addition/subtraction command signal 124 is a binary zero which causes the sample signal to be input to the adders 130 and 132. Subtraction is performed when the addition/subtraction command signal 124 is a binary one which causes the complement of the sample signal to be input to the adders. The subtraction is one's complement addition which requires that a binary one be added to the least significant bit. This is accomplished by applying the addition/subtraction command signal 124 to the carry-in terminal of adder 130. The carry-out terminal of adder 130 is connected to the carry-in terminal of adder 132. The carry-out terminal of adder 132 is connected to an AND gate 146 and an AND gate 147. The addition/subtraction command signal 124 is applied to the AND gate 146. The complement of the addition/subtraction command signal 124 is applied to the AND gate 147. The output signal 150 of the AND gate 146 is called the borrow bit output signal. The output signal 148 of the AND gate 147 is called the carry bit output signal. As the adders 130 and 132 successively add (at a rate proportional to V) the sample signal (which is proportional to I) to the contents of the latch 122 the carry bit output signals 148 and the borrow bit output signals 150 are produced at the overflow output 151 of addition circuit 118.

The addition circuit 118 shown in FIG. 6 can be operated in two modes. The first mode is obtained by using clock pulse signal $Q_4$ to reset the latch 122. In this first mode of operation the carry bit output signal 148 and borrow bit output signal 150 represent the product of $V_1$ and $V_2$. The borrow bit and carry bit output signals are applied to an up/down counter 154. The counter 154 continually counts the carry bit and borrow bit output signals which provides an indication of electrical energy. The overflow signal 158 from the counter 154 is used to increment a mechanical counter. The output terminals 145 are connected to a display and memory 156 (counter 152 is not used in this mode of operation) to provide an indication of power. The signal available at the output terminals 145 is the data output signal.

The second mode of operation is obtained by not using the clock pulse signal $Q_4$ to reset the latch 122. In this mode of operation the carry bit output signal 148 and the borrow bit output signal 150 are quantized energy signals representing quantized units of energy having a frequency which represents the product of the signals $V_1$ and $V_2$. This is the preferred mode of operation and is further described hereinafter.

FIG. 1 shows the carry bit output signal 148 and the borrow bit output signal 150 applied to a first up/down counter 152 and a second up/down counter 154. The first counter 152 counts between successive pulses of $Q_4$ (the time interval between the successive pulses of $Q_4$ is called a demand period) and provides that count to a display and memory 156. This provides an indication of power over the demand period as defined by clock pulse signal $Q_4$. The second counter 154 counts continuously which provides an indication of electrical energy and is chosen such that the overflow signal 158 is one-tenth of a kilowatt hour. This overflow signal 158 is used to increment a mechanical counter which provides a permanent display of the energy measured. The output terminals 145 are not used in this mode of operation.

Briefly summarizing the operation of the watthour meter circuit 10 shown in FIG. 1, transformers are used to develop analog signals proportional to the voltage and current components of an AC electrical energy quantity to be measured. The analog signal proportional to the current component is converted to a pulse train signal 29 which is sampled to provide a digitized value of the current component called the sample signal. The sample signal is first added to zero and the result is stored in a latch. The sample signal is then added to the contents of the latch (i.e. the sample signal is added to itself) with the result again stored in the same latch. The sample signal is repeatedly added to the contents of the latch. The rate of addition is controlled by converting the analog signal proportional to the voltage component to a pulse train signal which is applied to the latch to control the rate at which the latch accepts new data. The carry bit signals generated by the successive addition of the sample signal represent quantized units of energy which are applied to a counter and display.

What is claimed is:

1. A digital electric energy measuring circuit comprising:
   first input means responsive to a first analog signal representative of a current component and having positive and negative portions;
   second input means responsive to a second analog signal representative of a voltage component and having positive and negative portions;
   means producing a plurality of clock pulse signals each having a predetermined frequency;
   sampling means producing binary coded sample signals in response to a first clock pulse signal, said signals varying in response to the variations of said first analog signal;
   analog to frequency converter means producing a pulse train signal having a pulse repetition rate substantially faster than the frequency of said first clock pulse signal and varying in response to variations of said second analog signal;
   addition means having at least two data inputs, a triggering input, and a data output producing a data output signal, one of said data inputs being responsive to said sample signals, the other of said data inputs being responsive to said data output signal, said triggering input being responsive to said pulse train signal to produce at said data output the data output signal responsive to the sum of the signals at said data inputs such that said data output signal represents the product of said first and said second analog signals occurring between the clock pulses of said first clock pulse signal; and
   means for totalizing and displaying said data output signal responsive to said addition means.

2. The digital electric energy measuring circuit of claim 1 wherein the analog-to-frequency converter means includes a bi-directional voltage-to-frequency converter having at least first and second parallel circuit paths, the first circuit path being responsive to the positive portion of the second analog signal and the second circuit path being responsive to the negative portion of said second analog signal, and wherein each of said first and second circuit paths include integrating means having a charging and discharging capacitor, pulse generating means responsive to said integrating means, capacitor discharge means responsive to said pulse generating means for discharging said capacitor, said analog-to-frequency converter means further including a first gating means responsive to said pulse generating means of each of said first and second circuit paths for providing the pulse train signal, and first logic means responsive to said pulse generating means of each of said first and second circuit paths for providing a polarity indicating signal indicating the instantaneous polarity of said second analog signal.

3. The digital electric energy measuring circuit of claim 1 including another voltage-to-frequency converter means for producing pulses of a pulse train signal having a repetition rate varying in response to the variations of the first analog signal, and wherein the sampling means includes a counter for accumulating the pulses of said pulse train signal in response to a second clock pulse signal, and further including memory means producing at a parallel output thereof a binary coded output signal responsive to both said counter means and the first clock pulse signal such that between successive pulses of said first clock pulse signal said memory means produces said binary coded output signal that represents the accumulated number of pulses in said pulse train signal.

4. The digital electric energy measuring circuit of claim 1 wherein the addition means includes gating means providing an addition/subtraction command signal having first and second states responsive to common and opposite states, respectively, of the first and second analog signals, and including adding means having an input and an output producing an output signal, and including multiplexing means receiving the sample signals occurring at one of the data inputs and applying said sample signals to the input of said adding means in response to said first state of said addition/subtraction command signal, and further applying the complement of said sample signals to the input of said adding means in response to said second state of said addition/subtraction command signal, and further including accumulator means having the triggering input being responsive to the pulse train signal, and the data output producing the data output signal in response to both the output signal of said adding means and a clock pulse signal, said adding means further having the other of the data inputs being responsive to the data output signal, and an overflow output producing output signals representing the product of the first and the second analog signals responsive to both the data output signal of said accumulator means and the signals provided by said multiplexing means.

5. An electronic watthour meter circuit responsive to the voltage and current components of an AC electrical energy quantity to be measured, comprising: means producing a first analog signal having positive and negative portions responsive to said current component; means producing a second analog signal having positive and negative portions responsive to said voltage component; means converting said first analog signal to a first pulse train signal and a first polarity indicating signal, said first pulse train signal having a frequency responsive to the amplitude of said first analog signal, said first polarity indicating signal having first and second states, said first state responsive to said positive portion, said second state responsive to said negative portion of said first analog signal; means converting said second analog signal to a second pulse train signal and a second polarity indicating signal, said second pulse train signal having a frequency responsive to the amplitude of said second analog signal, said second polarity indicating signal having first and second states, said first state responsive to said positive portion, said second state responsive to said negative portion of said second analog signal; clock means producing plural clock pulse signals; means for sampling said first pulse train signal in response to said clock pulse signals, said means for sampling providing sample signals in binary form; accumulator means for storing binary values, and having an output signal responsive to the frequency of said second pulse train signal; summing means receiving said sample signals and incrementing said accumulator means by the value of said sample signals in response to the output signal of said accumulator and said first and second polarity signals, said summing means further producing quantized energy signals having a frequency representing the product of said first and said second analog signals; and totalizing means for totalizing and displaying said quantized energy signals in response to said summing means.

6. The electronic watthour meter circuit of claim 5 wherein the totalizing means includes a counter producing an output signal representing one-tenth of a kilowatt hour in response to the quantized energy signals, and further including a mechanical register responsive to said output signal representing one-tenth of a kilowatt hour.

7. The electronic watthour meter circuit of claim 5 wherein the totalizing means includes a counter producing an output signal at a parallel output thereof responsive to both a fourth clock pulse signal and the quantized energy signals, and further including a display and memory means responsive to both said output signal and a third clock pulse signal.

8. The electronic watthour meter circuit of claim 5 wherein the frequency of the second pulse train signal is greater than the frequency of the third clock pulse signal, and greater than the frequency of the fourth clock pulse signal.

9. The electronic watthour meter circuit of claim 5 wherein the totalizing means includes a first up/down counter producing a first output signal at a parallel output thereof responsive to both the fourth clock pulse signal and the quantized energy signals, and including a display and memory means responsive to both said first output signal and the third clock pulse signal, and including a second up/down counter producing a second output signal representing one-tenth of a kilowatt hour in response to the quantized energy signals, and including a mechanical register responsive to said second output signal.

* * * * *